US010679938B2

(12) United States Patent
Joardar et al.

(10) Patent No.: US 10,679,938 B2
(45) Date of Patent: Jun. 9, 2020

(54) POWER TRANSISTOR COUPLED TO MULTIPLE SENSE TRANSISTORS

(71) Applicant: TEXAS INSTRUMENTS INCORPORATED, Dallas, TX (US)

(72) Inventors: Kuntal Joardar, Plano, TX (US); Min Chu, Plano, TX (US); Vijay Krishnamurthy, Santa Clara, CA (US); Tikno Harjono, Cupertino, CA (US); Ankur Chauhan, Bangalore (IN); Vinayak Hegde, Uttara Kannada (IN); Manish Srivastava, Uttar Pradesh (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/050,383

(22) Filed: Jul. 31, 2018

(65) Prior Publication Data

US 2020/0043849 A1 Feb. 6, 2020

(51) Int. Cl.
*G11C 17/00* (2006.01)
*H01L 23/525* (2006.01)
*G11C 17/16* (2006.01)
*H01L 27/112* (2006.01)

(52) U.S. Cl.
CPC .......... *H01L 23/5256* (2013.01); *G11C 17/16* (2013.01); *H01L 27/11206* (2013.01)

(58) Field of Classification Search
CPC ........... H01L 23/5256; H01L 27/11206; G11C 17/16
USPC .......................................... 365/96, 205, 226
See application file for complete search history.

(56) References Cited

U.S. PATENT DOCUMENTS

| | | | |
|---|---|---|---|
| 2007/0190700 A1 | 8/2007 | Halamik et al. | |
| 2015/0099341 A1* | 4/2015 | Gruber | H01L 28/20 438/382 |
| 2016/0313378 A1* | 10/2016 | Duvjnak | G01R 19/10 |
| 2018/0069389 A1 | 3/2018 | Ihlenburg | |
| 2019/0123556 A1* | 4/2019 | Fang | H02H 9/046 |
| 2019/0204361 A1* | 7/2019 | Harjono | G01R 15/146 |

FOREIGN PATENT DOCUMENTS

DE 3906955 C1 7/1990

* cited by examiner

*Primary Examiner* — Connie C Yoha
(74) *Attorney, Agent, or Firm* — Jacqueline J. Garner; Charles A. Brill; Frank D. Cimino

(57) ABSTRACT

An electronic device comprises a first semiconductor die; a power transistor integrated in the first semiconductor die, the power transistor comprising a first gate, a first terminal, and a second terminal; a first sense transistor integrated in the first semiconductor die, the first sense transistor comprising a second gate and third and fourth terminals, the second gate coupled to the first gate and the fourth terminal coupled to the second terminal; a first resistor integrated in the first semiconductor die, the first resistor has a first temperature coefficient; a second sense transistor integrated in the first semiconductor die, the second sense transistor comprising a third gate and seventh and eighth terminals, the third gate coupled to the first gate and the eighth terminal coupled to the second terminal; and a second resistor integrated in the first semiconductor die, the second resistor has a second temperature coefficient.

20 Claims, 2 Drawing Sheets

POWER TRANSISTOR COUPLED TO MULTIPLE SENSE TRANSISTORS

BACKGROUND

Some electronic devices include measurement systems that compute high-magnitude signals (e.g., 10 A) using low-magnitude signals (e.g., 10 mA) derived from the high-magnitude signals.

SUMMARY

In accordance with at least one example of the disclosure, an electronic device comprises a first semiconductor die; a power transistor integrated in the first semiconductor die, the power transistor comprising a first gate, a first terminal, and a second terminal; a first sense transistor integrated in the first semiconductor die, the first sense transistor comprising a second gate and third and fourth terminals, the second gate coupled to the first gate and the fourth terminal coupled to the second terminal; a first resistor integrated in the first semiconductor die, the first resistor has a first temperature coefficient, the first resistor comprising a fifth terminal and a sixth terminal, wherein the third terminal is coupled to the fifth terminal; a second sense transistor integrated in the first semiconductor die, the second sense transistor comprising a third gate and seventh and eighth terminals, the third gate coupled to the first gate and the eighth terminal coupled to the second terminal; and a second resistor integrated in the first semiconductor die, the second resistor has a second temperature coefficient, the second resistor comprising a ninth terminal and a tenth terminal, wherein the seventh terminal is coupled to the ninth terminal.

In accordance with at least another example of the disclosure, an electronic fuse (eFuse), comprising a controller; a first transistor configured to conduct a load current between a first terminal and a second terminal of the first transistor, wherein the first terminal couples to the controller at a first node; a second transistor coupled to the first transistor at the second terminal, wherein a third terminal of the second transistor couples to the controller via a first resistor at a second node, the first resistor having a first temperature coefficient; and a third transistor coupled to the first transistor at the second terminal, wherein a fourth terminal of the third transistor couples to the controller via a second resistor at a third node, the second resistor having a second temperature coefficient, wherein the controller is configured to generate a first sense current that is a function of the first temperature coefficient and a second sense current that is a function of the second temperature coefficient.

In accordance with at least another example, a method, comprising measuring, by a controller, a first sense current and a second sense current, wherein the first sense current is received via a first sense transistor, and the second sense current is received via a second sense transistor, wherein the first and second transistors couple to a power transistor, wherein the first transistor couples to the controller via a first resistor and the second sense transistor couples to the controller via a second resistor; computing, by the controller, a desired sense current value using the first and second sense currents; and computing, by the controller, a load current flowing via the power transistor using the desired sense current value.

BRIEF DESCRIPTION OF THE DRAWINGS

For a detailed description of various examples, reference will now be made to the accompanying drawings in which.

DETAILED DESCRIPTION

Figure 1:
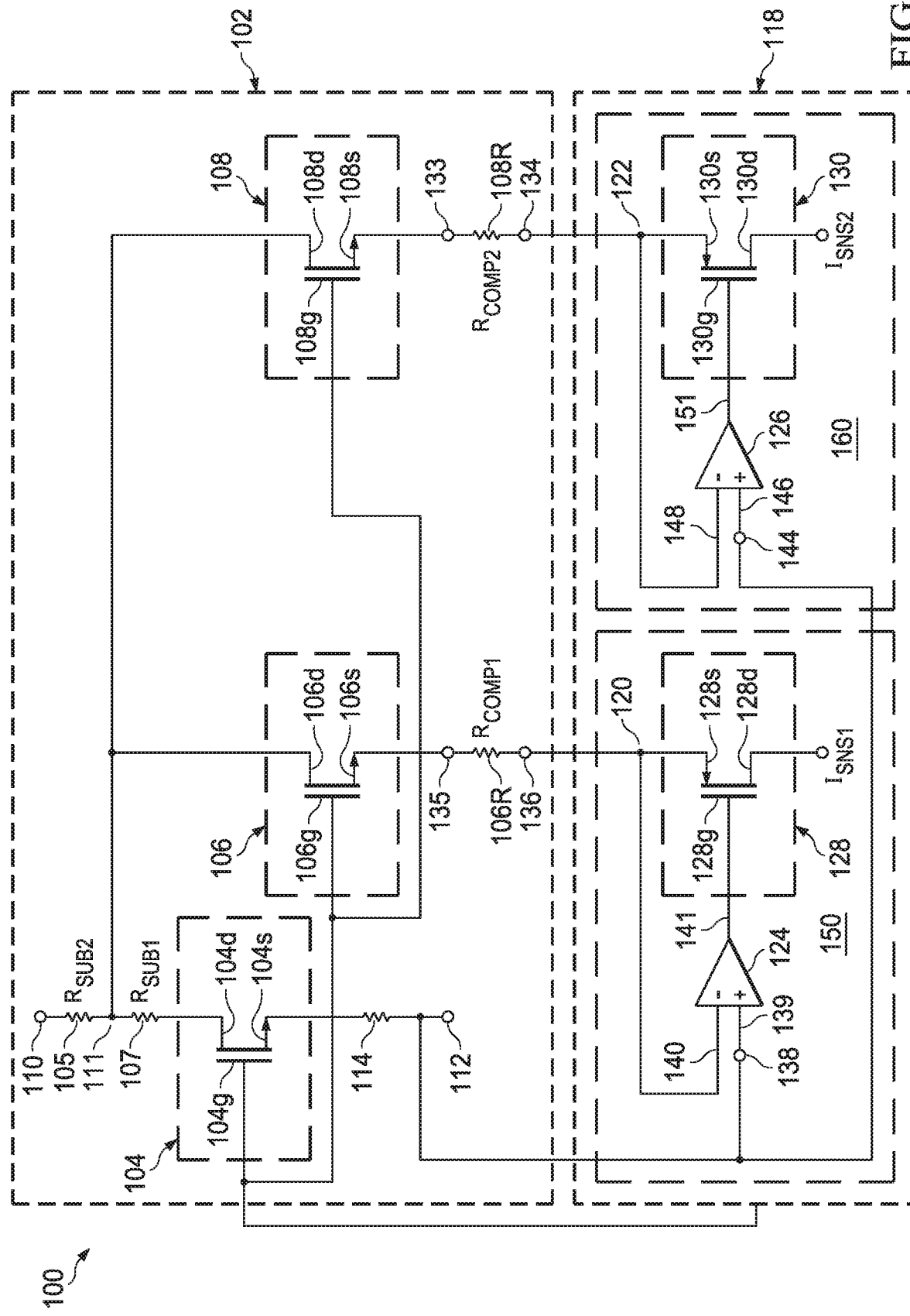
FIG. 1 shows an illustrative electronic device, in accordance with various examples.

Some power circuits employ power transistors that, in some cases, provide a current to a load (hereinafter referred to as load current). This load current is a large current (e.g., 10 A), which, in some power system applications, such as electronic fuse (eFuse), needs to be measured. It is preferable to measure such a large-magnitude current indirectly, in contrast with the direct measurement of the load current, for example, using an ammeter. The indirect measurement is typically done by coupling a sense transistor—which is smaller in size (e.g., smaller channel width) relative to the size of the power transistor—to the power transistor in such a fashion that when the power transistor is turned on, the sense transistor has a drain-source current (also referred herein as a sense current) indicative of the load current of the power transistor. Therefore, by measuring (or, in other words, sensing) the sense current, an indirect measurement can be made of the load current that is much larger in magnitude than the sense current. This indirect measurement is facilitated by using the sense transistor of a different size than the power transistor. The sizes can be chosen such that the load current relates to the sense current by a multiplicative factor. In some cases, this multiplicative factor is referred to as the sense ratio. Following sensing the sense current, the sense ratio can be multiplied with the sense current to compute the load current. Typically, a measurement circuit is employed that is coupled to the power and sense transistors to measure (or sense) the sense current and compute the load current.

The sense ratio is typically the ratio of resistances along the current flow paths of the sense transistor and power transistor, respectively. The resistance experienced by the current in sense and power transistors includes the parasitic resistance introduced because of the conducting properties of the materials used to fabricate the power and sense transistors. Furthermore, these parasitic resistances are different along the two current flow paths. Since resistance is a function of temperature, the parasitic resistances of both the power and sense transistors alter with temperature, but at different rates, which introduces error in the sense ratio, which further introduces error in measurement/computation of the load current. Stated another way, because the parasitic resistances of both the transistors vary differently with temperature, the sense ratio alters, thereby introducing error in the measured load current value as the sense current changes with temperature. Furthermore, the relationship of the sense current to the load current can vary as a function of the gate-to-source (VGS) bias provided to the power transistor.

To mitigate the effect of parasitic resistance and/or gate bias upon the sense current for a power circuit comprising a sense transistor and a power transistor, in accordance with the disclosed examples, at least two sense transistors are coupled to a power transistor. Each of the at least two sense transistors couple to a different resistor (hereafter referred as compensation resistor) at their respective source terminals. These compensation resistors, at least in part, compensate for the error introduced in the sense current due to temperature and gate-to-source bias change. In at least some examples, the temperature coefficient of the compensation resistors is different. In some examples, as further described below, the load current of the power transistor can be computed, at least in part, using the known temperature coefficient values of the compensation resistors and the sense currents measured from the sense transistors. Compensation resistors with different temperature coefficients can be fabricated by using an element (e.g., metal), or by compounding different elements (e.g., polysilicon and metal). In some examples, one compensation resistor comprises polysilicon, and the other compensation resistor comprises metal. In other examples, one compensation resistor may comprise of both metal and polysilicon, and the other compensation resistor may comprise of metal. In other examples, various other combinations of one or more elements can be used to fabricate compensation resistors with different temperature coefficients. In at least some examples, the temperature coefficients' values can be quantified.

Referring now to FIG. 1, an illustrative electronic device 100 is shown. The electronic device 100 includes a power transistor 104 that is integrated on a semiconductor die 102. The electronic device 100 also includes sense transistors 106, 108 that are integrated on the semiconductor die 102. In one example, the power transistor 104 and the sense transistors 106, 108 are n-metal-oxide-semiconductor field-effect-transistors (nMOSFET or nMOS). In such examples, the power transistor 104 includes a drain terminal 104d, a source terminal 104s, and a gate terminal 104g. The sense transistor 106 includes a drain terminal 106d, a source terminal 106s, and a gate terminal 106g. The sense transistor 108 includes a drain terminal 108d, a source terminal 108s, and a gate terminal 108g. The drain terminals 104d, 106d, and 108d couple to each other at a node 111.

In some examples, the power transistor 104 comprises a large number (e.g., on the order of 1000) of transistor cells integrated into the semiconductor die 102 and coupled together in parallel such that the power transistor 104 has a relatively large drain-source current when turned on. As noted above, in some examples, the sense transistors 106, 108 are fabricated on the same semiconductor die 102, and are fabricated in the same process flow as the power transistor 104. The sense transistors 104, 106 are sized much smaller than the power transistor 104. In some embodiments, the sense transistors 106, 108 comprise transistor cells integrated in the semiconductor die 102 and coupled together in parallel, but where the parallel-connected transistor cells making up the sense transistors 106, 108 are much smaller in number than the parallel-connected transistor cells making up the power transistor 104. In operation, when both the sense transistors 106, 108 and the power transistor 104 are turned on, the respective drain-source currents (i.e., the sense currents) of the sense transistors 106, 108 are much smaller than that of the power transistor 104.

From a manufacturing and fabrication standpoint, in some examples, the power transistor 104 and the sense transistors 106, 108 share a region of silicon that forms their drain terminals, such as drain terminals 104d, 106d, and 108d in the semiconductor die 102, effectively coupling together their respective drain terminals. This coupled drain terminal is denoted as drain terminal 110. This shared region of silicon can be referred to as a drain region in the semiconductor die 102 for some examples in which power and sense transistors are nMOS transistors. A resistor 105 and a resistor 107 represent a parasitic (and/or distributed) resistance of the drain terminal 110. Let $R_{SUB1}$ and $R_{SUB2}$ denote, respectively, the resistance contributions of the resistors 107 and 105 to the parasitic resistance of the drain terminal 110. The sum of these two parasitic resistances, $R_{SUB1}$ $R_{SUB2}$, is the total parasitic resistance of the drain terminal 110. Stated another way, the circuit of FIG. 1 shows the drain terminals 106d, 108d of the sense transistors 106, 108, respectively, connected to the node 111, indicating that the resistor 105 represents a parasitic resistance $R_{SUB2}$ in common with both the power transistor 104 and the sense transistors 106, 108. A resistor 114 represents a parasitic resistance associated with the source terminal 104s of the power transistor 104.

A resistor 106R has a first terminal 135 coupled to the source terminal 106d of the sense transistor 106, and a second terminal 136 coupled to a first node 120 of a sub-controller 150 that is a part of a controller 132. The controller 132, in some examples, includes other added circuitry (not expressly shown in FIG. 1) that controls the gate terminal 104g of the transistor 104. The controller unit 132, in some examples, includes a processing unit (not expressly shown in FIG. 1, but described below with respect to FIG. 2(a)) and storage (e.g., RAM (random-access memory), ROM (read-only memory)), which may include any suitable type of non-transitory computer-readable medium storing machine-executable instructions. The machine-executable instructions, when executed by the processing unit, cause the processing unit to perform one or more of the actions attributed herein to the controller unit 132. The controller unit 132 includes the first sub-controller 150 ("sub-controller 150") and a second sub-controller 160 ("sub-controller 160") that are coupled to the transistors 106, 108, respectively, and are configured to sense/measure a first sense current $I_{SNS1}$ and a second sense current $I_{SNS2}$, respectively. Both the first and the second sense currents, as further noted below, facilitate computing the desired sense current of the transistor 104, which, in turn, facilitates computing the drain-source current of the transistor 104. In the particular example illustrated in FIG. 2, the controller 132 is integrated on a second semiconductor die 118. In some examples, the controller 132 is integrated on the semiconductor die 102.

The sub-controller 150 includes a node 138 is coupled to a terminal 112 of the power transistor 104. The terminal 112 is coupled to the source terminal 104s via the resistor 114. The sub-controller 150 is coupled to the resistor 106R to provide a virtual connection from the resistor 106R to the terminal 112 of the power transistor 104. The sub-controller 150 includes an operational amplifier 124 comprising a first input port 139 coupled to the terminal 112 of the power transistor 104, a second input port 140 coupled to the second terminal 136 of the resistor 106R, and an output port 141. The sub-controller 150 further includes a pass transistor 128 having a gate terminal 128g, a source terminal 128s, and a drain terminal 128d. The gate terminal 128g coupled to the output port 141 of the operational amplifier 124, and a source terminal 128s coupled to the terminal 136 of the resistor 106R. The sub-controller 150 includes a negative feedback arrangement in which the sub-controller 150 is coupled to the resistor 106R and to the terminal 112 of the power transistor 104 to maintain a first voltage at the first node 120 to substantially equal a second voltage at the node 138. The sub-controller 150 causes only a negligible amount of current to flow from the second terminal 136 of the resistor 106R to the terminal 112 of the power transistor 104, thereby providing a virtual connection between the nodes 138 and 120.

Similar to the resistor 106R, a resistor 108R has a first terminal 133 coupled to the source terminal 108s of the sense transistor 108, and a second terminal 134 coupled to a first node 122 of a sub-controller 160 that, as noted above, is a part of a controller 132. The sub-controller 160 includes a node 144 coupled to the terminal 112 of the power transistor 104. The sub-controller 160 is coupled to the resistor 108R to provide a virtual connection from the resistor 108R to the terminal 112 of the power transistor 104. The sub-controller 160 includes an operational amplifier 126 comprising a first input port 146 coupled to the terminal 112 of the power transistor 104, a second input port 148 coupled to the second terminal 124 of the resistor 108R, and an output port 151. The sub-controller 160 further includes a pass transistor 130 having a gate terminal 130g, a source terminal 130s, and a drain terminal 130d. The gate terminal 130g coupled to the output port 151 of the operational amplifier 126, and a source terminal 130s coupled to the terminal 134 of the resistor 108R. The sub-controller 160 includes a negative feedback arrangement in which the sub-controller 160 is coupled to the resistor 108R and to the terminal 112 of the power transistor 104 to maintain a first voltage at the first node 122 to substantially equal a second voltage at the node 144. The sub-controller 160 causes only a negligible amount of current to flow from the second terminal 134 of the resistor 108R to the terminal 112 of the power transistor 104, thereby providing a virtual connection between the nodes 144 and 122.

The resistors 106R, 108R are integrated on the semiconductor die 102. The resistors 106R, 108R have different temperature coefficients. For example, the resistor 106R can be fabricated by using an element (e.g., metal), or by compounding different elements (e.g., polysilicon and metal). The temperature coefficient of the resistor 106R can be notated by $TC_{106}$. On the other hand, the resistor 108R can be fabricated using different combinations of one or more elements such that the resulting temperature coefficient of the resistor 108R is different than the temperature coefficient of the resistor 106R. The temperature coefficient of the resistor 108R can be notated by $TC_{108}$, and the temperature coefficients $TC_{106}$ and $TC_{108}$ are unequal. In at least some examples, the resistors 106R, 108R are designed to have resistances that compensate the effect that the parasitic resistance has on computing the drain-source current of the transistor 104. In at least some examples, these temperature coefficient values can be quantified and are stored in the memory of the controller unit 132. In some scenarios, the stored values of the temperature coefficients need to be corrected because temperature coefficients may vary over time, or due to some other reason. In such scenarios, the controller unit 132 may be configured to auto-correct the temperature coefficient values by using, at least in part, equation 1 described below.

The load current is a product of the sense ratio and the sense current, and the sense ratio, as noted above, is the ratio of the resistance seen by the sense current to the resistance seen by the load current. Therefore, the sense current Isns can be expressed as $$I_{sns} = I_L \frac{R_L}{R_S},$$

where $I_L$ is the load current, $R_L$ is the resistance seen by the load current, and $R_S$ is the resistance seen by the sense current. These resistances can be expressed as quadratic functions of temperature leading to the following expression for the sense current: $I_{sns}=I_{snso}(1+TC1_{sns}\Delta T+TC2_{sns}\Delta T^2)$.

Here, $I_{snso}$ is the desired sense current (or, in other words, temperature-independent sense current), $\Delta T$ is the change is temperature, and $TC1_{sns}$ and $TC2_{sns}$ are the linear and quadratic temperature coefficients, respectively, of the desired sense current. In some scenarios, a true sense ratio value is stored in the controller unit 132, and the sensed current is adjusted (or, in some examples, auto-corrected) for temperature variations.

As noted above, the sub-controller 150 causes only a negligible amount of current to flow from the second terminal 136 of the resistor 106R to the terminal 112 of the power transistor 104, thereby providing a virtual connection between the nodes 138 and 120. Similarly, sub-controller 160 causes only a negligible amount of current to flow from the second terminal 134 of the resistor 108R to the terminal 112 of the power transistor 104, thereby providing a virtual connection between the nodes 138 (or the node 144) and 122. Stated another way, the voltage potential at node 120 and the voltage potential at node 138 is substantially similar; and the voltage potential at node 122 and the voltage potential at node 144 are substantially similar. Referring now to the operation of the electronic device 100, as the transistor 104 is turned on (by a gate signal sent via the controller unit 132), the load current flows from the transistor 104 (depending on the drain-to-source voltage). The transistors 106, 108 are coupled to the transistor 104 such that a current mirroring the load current flows from the transistors 106, 108. Since the operational amplifiers 124 and 126 have very high input impedance, the sense currents flowing through the transistors 106, 108 continue flowing un-attenuated through the pass transistors 128, 130, respectively, as $I_{SNS1}$ and $I_{SNS2}$. The pass transistors 128, 130 are biased such that the transistors 128, 130 are operating in the saturation region and, as such, the currents flowing through them are dependent only on their respective gate voltages. Because of the negative feedback arrangement used in the sub-controllers 150, 160, a disturbance that may cause the potential at node 120, 122 to differ from the potential at node 138, 144, respectively, is compensated by the operational amplifiers 124, 126, respectively. Stated another way, if the mirroring of the currents between the power transistor 104 and the sense transistors 106, 108 is distorted, it is compensated by an equivalent adjustment in the output of the operational amplifier 124, 126 which is coupled to the gate of the pass transistors 128, 130, respectively. This results in the voltage at nodes 120, 122 and the sense current $I_{SNS1}$, $I_{SNS2}$, respectively, to be automatically corrected.

In some of the examples described above, the transistors 104, 106, 108 are each n-metal-oxide-semiconductor field-effect-transistors (nMOSFETs). In other examples, the transistors 104, 106, 108 are each p-metal-oxide-semiconductor field-effect-transistors (pMOSFETs). In some examples, the transistors 106, 108 are a vertical nMOSFET. However, examples are not limited to vertical transistors, and may include lateral transistors. In an example illustrated in FIG. 1, the pass transistors 128, 130 are a p-metal-oxide-semiconductor field-effect-transistor (pMOSFET). In other examples, the transistors 128, 130 are a n-metal-oxide-semiconductor field-effect-transistor (nMOSFET).

Figure 2A:
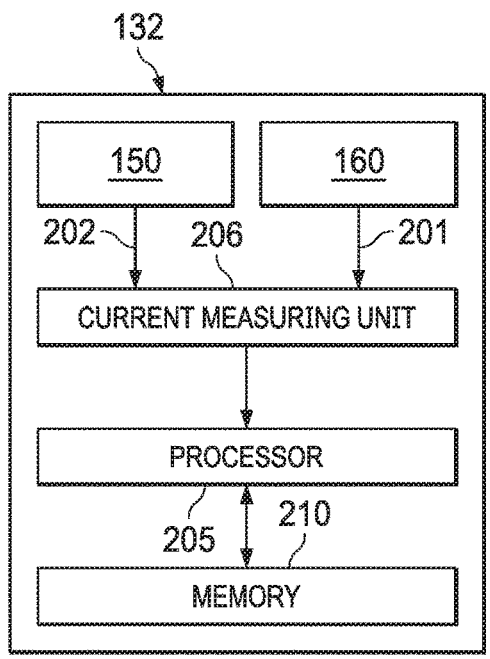
FIG. 2(a) shows an illustrative controller unit of an electronic device, in accordance with various examples.

Referring now to FIG. 2(a), an illustrative controller unit 132 is shown. The controller unit 132 facilitates computing a desired sense current, which, in-turn, facilitates computing the drain-to-source current of the power transistor. The controller unit 132, in one example, includes a processing unit (hereinafter "processor") 205, a memory unit (hereinafter "memory") 210 coupled to the processor 205. The current measuring unit 206 couples to the processor 205. In some examples, memory 210 includes RAM (random-access memory, and ROM (read-only memory). In some examples, memory 210 includes any suitable type of non-transitory computer-readable medium storing machine-executable instructions. The machine-executable instructions, when executed by the processor 205, cause the processor 205 to perform one or more of the actions attributed herein to the controller unit 132. The sub-controllers 150, 160 couple to the current measuring unit 206 via conductors 202, 201, respectively. In some examples, the current measuring unit 206 includes one or more resistors of known values that are configured to convert the sense current $I_{SNS1}$, $I_{SNS2}$ to voltages $V_{SNS1}$ and $V_{SNS2}$. These voltages may further be digitized using analog-to-digital converters—whose output can be processed in the controller unit 132.

Figure 3:
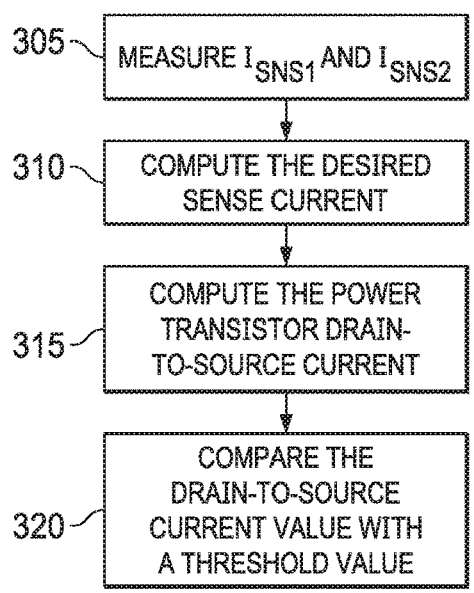
FIG. 3 shows an illustrative method for computing a sense current, in accordance with various examples.

The processor 205 is configured to compute the desired sense current $I_{SNS0}$, and, in-turn, compute the drain-to-source current of the transistor 104. Referring now to FIG. 3, an illustrative method 300 for computing the desired sense current $I_{SNS0}$ is shown. The method 300 begins with a step 305 that includes measuring the first sense current $I_{SNS1}$ and a second sense current $I_{SNS2}$. This is done by the current measuring unit 206 present in the controller unit 132. Following the current measurement, the measured values may be communicated to the processor 205, or in some examples, stored in the memory 210. The method 300 then moves to the step 310 that includes computing the desired sense current $I_{SNS0}$. In some examples, this computation is performed by using a current-temperature relationship that defines first and second currents as:

$$I_{sns1} = I_{sns0}(1 + TC1_{sns1}\Delta T + TC2_{sns1}\Delta T^2) \quad (1)$$

$$I_{sns2} = I_{sns0}(1 + TC1_{sns2}\Delta T + TC2_{sns2}\Delta T^2) \quad (2)$$

where $I_{SNS1}$, $I_{SNS2}$ are the sense current values received from the sub-controllers 150, 160; $I_{SNS0}$ is the desired sense current value; $TC1_{sns1}$, $TC1_{sns2}$ are the linear temperature coefficient values of the sense current associated with 106 and 108, respectively; $TC2_{sns1}$, $TC2_{sns2}$ are the quadratic temperature coefficient values of the sense current associated with 106 and 108, respectively; and $\Delta T$ is the temperature change value. The $\Delta T$ and $I_{SNS0}$ values are unknown. Both the quadratic relationships defined above have three known variables (e.g., $TC1_{sns1}$, $TC2_{sns1}$, and $I_{SNS1}$ in equation 1; and $TC1_{sns2}$, $TC2_{sns2}$ and $I_{SNS2}$ in equation 2) and two unknown variables. The known variables $TC1_{sns1}$, $TC2_{sns1}$, $TC1_{sns2}$, $TC2_{sns2}$, may be stored in the memory 210. $\Delta T$ can be computed by the processor 205 using equation 3 depicted below:

$$\Delta T = \frac{-(I_{sns1}TC1_{sns2} - I_{sns2}TC1_{sns1}) \pm \sqrt{(I_{sns1}TC1_{sns2} - I_{sns2}TC2_{sns1})^2 - 4(I_{sns1}TC2_{sns2} - I_{sns2}TC2_{sns1})(I_{sns1} - I_{sns2})}}{2(I_{sns1}TC2_{sns2} - I_{sns2}TC2_{sns1})}$$

whereas, $I_{SNS0}$ value can be computed using equation 4 depicted below:

$$I_{sns0} = \frac{I_{sns1}}{(1 + TC1_{sns1}\Delta T + TC2_{sns1}\Delta T^2)} = \frac{I_{sns2}}{(1 + TC1_{sns2}\Delta T + TC2_{sns2}\Delta T^2)}$$

Following computing the desired current sense $I_{SNS0}$, the method 300 moves to a step 315 that includes computing the drain-to-source current of the transistor 104. This is done by using the pre-defined sense ratio value and the desired current sense $I_{SNS0}$ value. For example, assuming the sense ration is defined by "SR," the drain-to-source current of the transistor 104 is $SR \times I_{SNS0}$. The method 300, in some examples, then moves to the step 320 that includes comparing the drain-to-source current value with a threshold value. If the drain-to-source current value is higher than the threshold, the controller unit 132 performs an action based on the comparison. For example, in eFuse applications, the controller unit 132 may be configured to turn-off the current flow in a situation where flow of current in an electrical system is equal to or more than a rated (e.g., threshold) value.

Figure 2B:
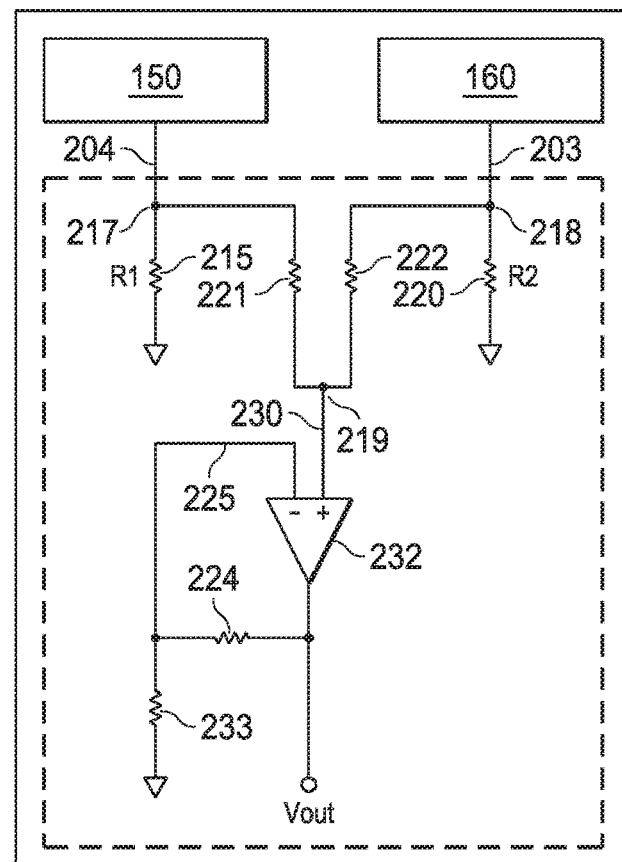
FIG. 2(b) shows another illustrative controller unit of an electronic device, in accordance with various examples.

Some examples of the controller unit 132 may include analog circuitry to generate the desired sense current $I_{SNS0}$ value, which, in turn, may be used to compute the drain-to-source current of the transistor 104. Referring now to FIG. 2(b), an illustrative controller unit 132 is shown that includes a weighted average technique to compute the desired sense current $I_{SNS0}$. In some examples, such technique includes resistors 215, 220 with resistances R1, R2, respectively. Such technique may further include additional resistors 221, 221 coupled to the resistors 215, 220 at nodes 217, 218, respectively. The resistance of the resistors 221, 222 may be higher than the resistances R1, R2, such that the resistances R1, R2 acts as the weights in the weighted average technique. The resistors 221, 222 couple at a node 219, which further couples to an operational amplifier 232 via a conductor 230. The operational amplifier 232 includes a feedback resistor 244. In the example depicted in FIG. 2(b), the negative terminal of the operational amplifier 232 is coupled to a ground source (or a virtual ground source) via a terminal 225 and/or a resistor 233. An output $V_{out}$ of the operational amplifier 232 can be computed by the following weighted averaged equation: $V_{out} = R_1 I_{SNS1} + R_2 I_{SNS2}$. This output $V_{out}$ may further be digitized using analog-to-digital converters, and the digitized data may be processed in a processor (not expressly depicted) similar to the processor 205.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless

What is claimed is:

1. An electronic device comprising:
   a first semiconductor die;
   a power transistor integrated in the first semiconductor die, the power transistor comprising a first gate, a first terminal, and a second terminal;
   a first sense transistor integrated in the first semiconductor die, the first sense transistor comprising a second gate and third and fourth terminals, the second gate coupled to the first gate and the fourth terminal coupled to the second terminal;
   a first resistor integrated in the first semiconductor die, the first resistor has a first temperature coefficient, the first resistor comprising a fifth terminal and a sixth terminal, wherein the third terminal is coupled to the fifth terminal;
   a second sense transistor integrated in the first semiconductor die, the second sense transistor comprising a third gate and seventh and eighth terminals, the third gate coupled to the first gate and the eighth terminal coupled to the second terminal; and
   a second resistor integrated in the first semiconductor die, the second resistor has a second temperature coefficient different than the first temperature coefficient, the second resistor comprising a ninth terminal and a tenth terminal, wherein the seventh terminal is coupled to the ninth terminal.

2. The electronic device of claim 1, wherein:
   the first terminal is a source of the power transistor;
   the second terminal is a drain of the power transistor;
   the third terminal is a source of the first sense transistor;
   the fourth terminal is the drain of the first sense transistor;
   the seventh terminal is a source of the second sense transistor; and
   the eighth terminal is the drain of the second sense transistor.

3. The electronic device of claim 2, wherein the power transistor, the first sense transistor, and the second sense transistor are each n-metal-oxide-semiconductor field-effect-transistors (nMOSFETs).

4. The electronic device of claim 2, wherein the power transistor, the first sense transistor, and the second sense transistor are each p-metal-oxide-semiconductor field-effect-transistors (pMOSFETs).

5. An electronic device comprising:
   a first semiconductor die;
   a power transistor integrated in the first semiconductor die, the power transistor comprising a first gate, a first terminal, and a second terminal;
   a first sense transistor integrated in the first semiconductor die, the first sense transistor comprising a second gate and third and fourth terminals, the second gate coupled to the first gate and the fourth terminal coupled to the second terminal;
   a first resistor integrated in the first semiconductor die, the first resistor has a first temperature coefficient, the first resistor comprising a fifth terminal and a sixth terminal, wherein the third terminal is coupled to the fifth terminal;
   a second sense transistor integrated in the first semiconductor die, the second sense transistor comprising a third gate and seventh and eighth terminals, the third gate coupled to the first gate and the eighth terminal coupled to the second terminal;
   a second resistor integrated in the first semiconductor die, the second resistor has a second temperature coefficient, the second resistor comprising a ninth terminal and a tenth terminal, wherein the seventh terminal is coupled to the ninth terminal;
   a controller unit, the controller unit comprising:
      a first node coupled to the sixth terminal of the first resistor;
      a second node coupled to the tenth terminal of the second resistor; and
      a third node coupled to the first terminal of the power transistor.

6. The electronic device of claim 5, further comprising:
   a second semiconductor die, wherein the controller unit is integrated in the second semiconductor die.

7. The electronic device of claim 5, wherein the controller is configured to provide a virtual connection from the sixth terminal to the first terminal and a virtual connection from the tenth terminal to the first terminal.

8. The electronic device of claim 5, the controller is configured to maintain a first voltage at the first node that substantially equals a second voltage at the second node and a third voltage at the third node.

9. The electronic device of claim 5, wherein the controller is configured to produce a first sense current and a second sense current and is further configured to compute a desired sense current value using the first and second sense currents, wherein the desired sense current is a scaled-down version of a current flowing between the first terminal and the second terminal.

10. The electronic device of claim 1, wherein the first and second temperature coefficients are of different magnitudes.

11. An electronic fuse (eFuse), comprising:
   a controller;
   a first transistor configured to conduct a load current between a first terminal and a second terminal of the first transistor, wherein the first terminal couples to the controller at a first node;
   a second transistor coupled to the first transistor at the second terminal, wherein a third terminal of the second transistor couples to the controller via a first resistor at a second node, the first resistor having a first temperature coefficient; and
   a third transistor coupled to the first transistor at the second terminal, wherein a fourth terminal of the third transistor couples to the controller via a second resistor at a third node, the second resistor having a second temperature coefficient different from the first temperature coefficient,
   wherein the controller is configured to generate a first sense current that is a function of the first temperature coefficient and a second sense current that is a function of the second temperature coefficient.

12. The eFuse of claim 11, wherein the controller is configured to compute a desired current value using the first and the second sense currents.

13. The eFuse of claim 12, wherein the controller is configured to turn-off an electrical system if the controller determines that the desired current value is greater than a pre-defined value.

14. The eFuse of claim 11, wherein the first, second, and third transistors are each n-metal-oxide-semiconductor field-effect-transistors (nMOSFETs).

15. The eFuse of claim 11, wherein the first, second, and third transistors are each p-metal-oxide-semiconductor field-effect-transistors (pMOSFETs).

16. The eFuse of claim 11, wherein the controller is configured to provide a virtual connection from the first terminal to the third terminal and a virtual connection from the first terminal to the fourth terminal.

17. The eFuse of claim 11, the controller is configured to maintain a first voltage at the first node that substantially equals a second voltage at the second node and a third voltage at the third node.

18. A method, comprising:
measuring, by a controller, a first sense current and a second sense current, wherein the first sense current is received via a first sense transistor, and the second sense current is received via a second sense transistor, wherein the first and second transistors couple to a power transistor, wherein the first transistor couples to the controller via a first resistor and the second sense transistor couples to the controller via a second resistor;
computing, by the controller, a desired sense current value using the first and second sense currents; and
computing, by the controller, a load current flowing via the power transistor using the desired sense current value.

19. The method of claim 18 further comprising:
comparing, by the controller, the load current with a threshold value; and
facilitating turning-off an electrical system based on the determination that the load current is higher than or equal to the threshold value.

20. The method of claim 18, wherein the first resistor has a first temperature coefficient and the second resistor has a second temperature coefficient, and wherein the first and second temperature coefficients are different.

* * * * *